United States Patent
Sloane et al.

(10) Patent No.: US 7,587,641 B1
(45) Date of Patent: Sep. 8, 2009

(54) ENCODING OF DATA INTO CONSTANT WEIGHT CODES

(76) Inventors: Neil James Alexander Sloane, 11 S. Adelaide Ave., Highland Park, NJ (US) 08904; Chao Tian, Rue du Cret #3, CH1006 Lausanne (CH); Vinay Anant Vaishampayan, 48 Tall Oaks Dr., Summit, NJ (US) 07901

( * ) Notice: Subject to any disclaimer, the term of this patent is extended or adjusted under 35 U.S.C. 154(b) by 674 days.

(21) Appl. No.: 11/448,550

(22) Filed: Jun. 7, 2006

(51) Int. Cl.
*H03M 7/20* (2006.01)
(52) U.S. Cl. ........................... 714/701; 341/102
(58) Field of Classification Search ............... 714/701; 341/102
See application file for complete search history.

(56) References Cited

U.S. PATENT DOCUMENTS

| | | | | |
|---|---|---|---|---|
| 4,569,050 A | * | 2/1986 | Ohme | 714/775 |
| 4,613,860 A | * | 9/1986 | Currie et al. | 340/825.57 |
| 6,462,898 B2 | * | 10/2002 | Blaum et al. | 360/77.08 |
| 6,661,355 B2 | * | 12/2003 | Cornelius et al. | 341/58 |
| 7,075,461 B2 | * | 7/2006 | Kim | 341/58 |
| 7,164,373 B2 | * | 1/2007 | Shim et al. | 341/102 |

* cited by examiner

*Primary Examiner*—Stephen M Baker
(74) *Attorney, Agent, or Firm*—Henry T. Brendzel

(57) ABSTRACT

A method that employs a piecewise linear algorithm, P, to map m-dimensional symbols into code tuples, followed by the construction of codes of weight m from the code tuples. To reverse the operation, constant weight codes are converted to code tuples, and a reverse piecewise linear algorithm P' is used to map the code tuples into symbols, from which data is recovered. The m-dimensional symbols are obtained from mapping of input data into the symbols, which are contained within an m-dimensional parallelopiped, with each coordinate having a different span but the symbols along each of the coordinate are equally spaced apart. The code tuples, which are obtained by employing process P, are contained within an m-dimensional simplex.

6 Claims, 6 Drawing Sheets

ENCODING OF DATA INTO CONSTANT WEIGHT CODES

BACKGROUND

This invention relates to coding of data.

A binary constant weight code is a code where each member of the code (i.e., each codeword) has the same number of 1's. Constant weight codes have numerous applications.

A conventional general purpose technique for encoding data into constant weight codes is based on a recursive expression for determining the lexicographic index of an element of a codebook. The operation of encoding is equivalent to determining the codeword, given its index, and the operation of decoding is equivalent to determining the index, given the codeword. If $b=(b_1, b_2, K, b_n)$ is used to denote the codeword, $b_i \in \{0, 1\}$, the lexicographic index $v(b)$ is $$v(b) = \sum_{m=1}^{n} b_m \binom{n-m}{w_m} \quad (1)$$

where $w_m$ is the number of ones in the m-bit prefix of b. See T. M. Cover, "Enumerative source encoding," IEEE Trans. Information Theory, vol. 19, no. 1, pp. 73-77, January 1973; and J. P. M. Schalkwijk, "An algorithm for source coding," IEEE Trans. Information Theory, vol. IT-18, pp. 395-399, May 1972. The resulting code is fully efficient, but the complexity of the technique limits its direct application to small block lengths. This is mainly due to the fact that the binomial coefficients in (1) become extremely large, requiring extended precision arithmetic to prevent overflow errors.

Arithmetic coding is an efficient variable length coding technique for finite alphabet sources. Given a source alphabet and a simple probability model for sequences, with $p(x)$ and $F(x)$ denoting the probability distribution and cumulative distribution function of sequence x, respectively, an arithmetic encoder represents x by a number in the interval $[F(x)-p(x), F(x)]$. The implementation of such an arithmetic coder can also run into problems with very long registers, but elegant finite-length implementations are known and are widely used. See I. H. Witten et al., "Arithmetic coding for data compression," Communications of the ACM, vol. 30, pp. 520-540, June 1987. For constant weight codes, the idea is to reverse the roles of encoder and decoder, i.e., to use an arithmetic decoder as an encoder and an arithmetic encoder as a constant weight decoder. An efficient algorithm for implementing such codes using the arithmetic coding approach is given in T. V. Ramabadran, "A coding scheme for m-out-of-n codes," IEEE Trans. Communications, vol. 38, no. 8, pp. 1156-113, August 1990. The probability model used by the coder is adaptive, in the sense that the probability that the incoming bit is a 1 depends on the number of 1's that have already occurred. This approach successfully overcomes the finite-register-length constraints associated with computing the binomial coefficients and the resulting efficiency is often very high, the loss of information bits being one bit or less, in most cases. The encoding complexity of the method is $O(n)$.

A different method for encoding and decoding balanced constant weight codes was developed by Knuth, as described in D. E. Knuth, "Efficient balanced codes," IEEE Trans. Information Theory, vol. 32, no. 1, pp. 51-53, January 1986, and is referred to as the complementation method. The method relies on the key observation that if the bits of a length-k binary sequence are complemented sequentially, starting from the left, there must be a point at which the weight is equal to $\lfloor k/2 \rfloor$. Given the transformed sequence, it is possible to recover the original sequence by specifying how many bits were complemented (or the weight of the original sequence). This information is provided using check bits of constant weight, and the resulting code consists of the transformed original sequence followed by the constant weight check bits.

In a series of papers, Bose and colleagues extended Knuth's method in various ways, and determined the limits of this approach. See, for example, J.-H. Youn and B. Bose, "Efficient encoding and decoding schemes for balanced codes," IEEE Trans. Computers, vol. 52, no. 9, pp. 1229-1232, September 2003, and the references therein. Knuth's method is simple and efficient, and even though the overall complexity is $O(n)$, for $n=100$ it can be eight times as fast as the method based on arithmetic codes. However, this method only works for balanced codes, which restricts its applicability.

In light of the available prior art, what is still needed is an effective and fast method for encoding and decoding constant weight codes that is not restricted in its applicability.

SUMMARY

An advance in the art is realized with a method that employs a piecewise linear algorithm, P, to map m-dimensional symbols into code tuples, followed by the construction of codes of weight m from the code tuples. To reverse the operation, constant weight codes are converted to code tuples, and a reverse piecewise linear algorithm P' is used to map the code tuples into symbols, from which data is recovered. The m-dimensional symbols are obtained from mapping of input data into the symbols, which are contained within an m-dimensional parallelopiped, with each coordinate having a different span but in which the symbols along each of the coordinate axes are equally spaced apart. The code tuples, which are obtained by employing process P, are contained within an m-dimensional simplex.

DETAILED DESCRIPTION

A binary constant weight five-bit code of weight 2 is a code whose members (code words) have 5 bits each, and precisely 2 of the bits are 1's. This is illustrated in the first (left most) column below:

| | |
|---|---|
| 00011 | (4, 5) |
| 00101 | (3, 5) |
| 00110 | (3, 4) |
| 01001 | (2, 5) |
| 01010 | (2, 4) |
| 01100 | (2, 3) |
| 10001 | (1, 5) |
| 10010 | (1, 4) |
| 10100 | (1, 3) |
| 11000 | (1, 2) |

This code can be described by two-number tuples as shown in the second column in the above table, where each number describes the ordinal position of the "1" in the code. Thus, the (3,4) tuple (third row of the table), for example, states that there is a 1 in the third and fourth bit (counting from the left) of the associated code word. Henceforth herein, tuples that describe a code word in a constant weight code are referred to as code tuples.

Figure 1:
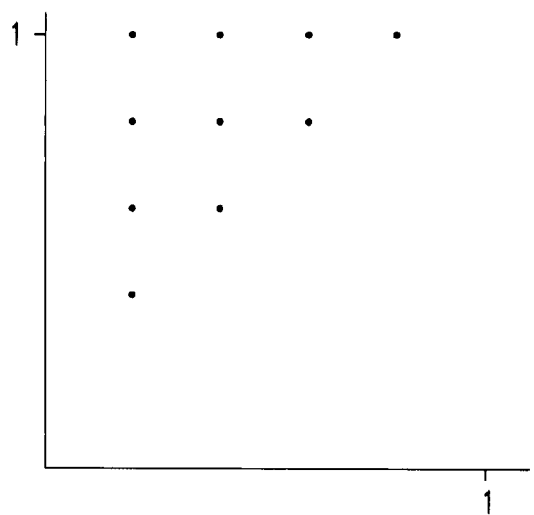
FIG. 1 depicts code tuples of a weight 2 constant weight code of length 5.

It may be noted that the codewords in the above table are effectively ordered in descending order, from one row to the next row, and that the numbers in the tuple are ordered in an ascending order (viewed from the left). If the first number is designated by $y_1$ and the second number is designated by $y_2$, then one can say that $$0 < y_1 < y_2 \leq n, \quad (2)$$

where n is the number of bits in a code word, or the code length. It may also be noted that the code tuples reduce dimensionality; in this case, from 5 to 2, and that the two-dimensional tuples, when normalized to 1 (i.e., all numbers are divided by 5) and depicted in a two-dimensional graph, occupy a triangle, as shown in FIG. 1. The normalized number $y_1$ is designated $x_1$, and it is depicted along the (conventional) x axis. The normalized number $y_2$ is designated $x_2$, and it is depicted along the (conventional) y axis. The discussion below employs the normalized values for consistency and convenience.

Figure 2:
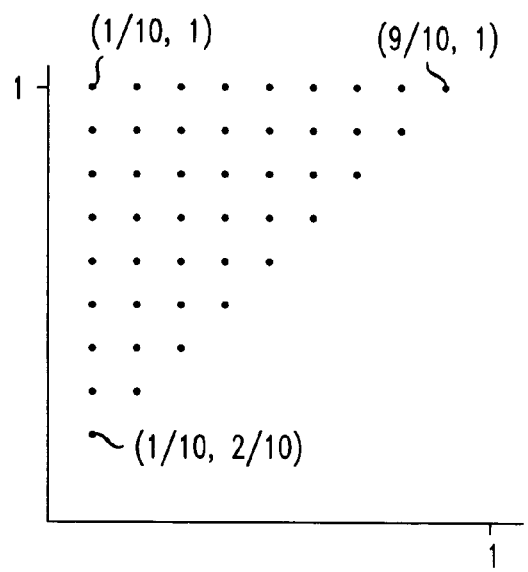
FIG. 2 depicts code tuples of a weight 2 constant weight code of length 10.

FIG. 2 shows the tuples for a length-10 code of constant weight 2. It may be observed that as the length of the code increased from 5 to 10 (i.e., from FIG. 1 to FIG. 2) the upper right hand corner of the triangle moved from (0.8,1) to (0.9, 1), and by induction one realizes that the upper right hand corner of the triangle is defined generally by $(1-\delta,1)$, where $\delta=1/n$ and, hence, d diminishes toward 0 as n increases. Similarly, the upper left hand corner of the triangle is defined by $(\delta,1)$, and the lower corner of the triangle is defined by $(\delta,2\delta)$. This is effectively described by triangle 10 in FIG. 3A.

Figure 4A:
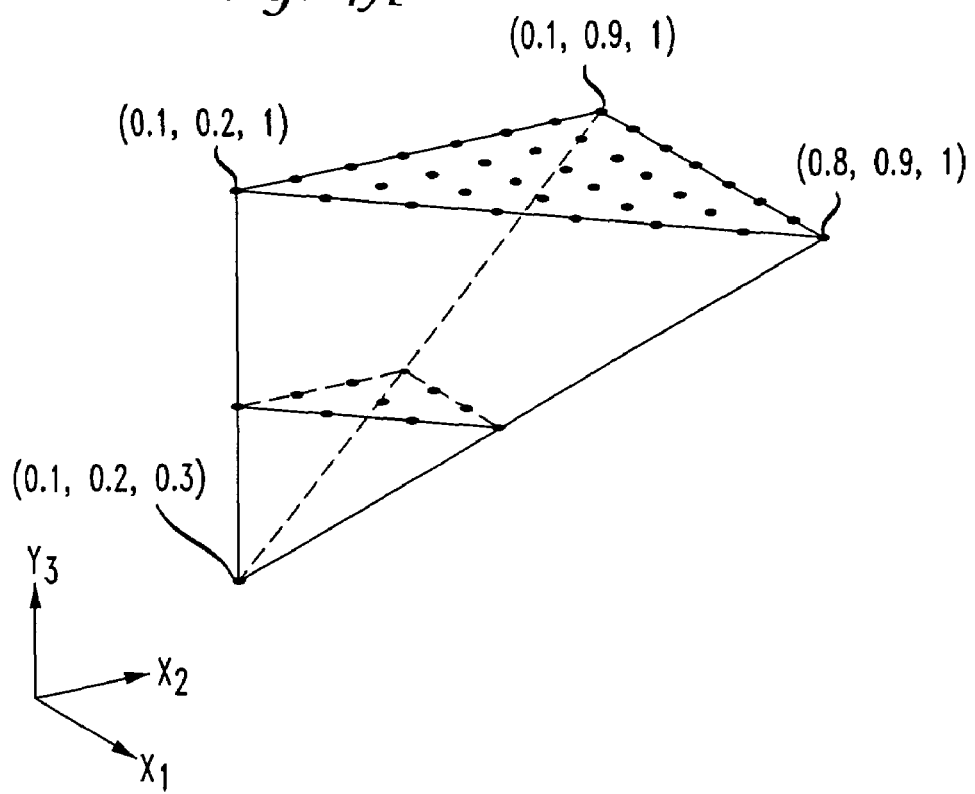
FIG. 4A depicts code tuples of a weight 3 constant weight code of length 10.
Figure 4B:
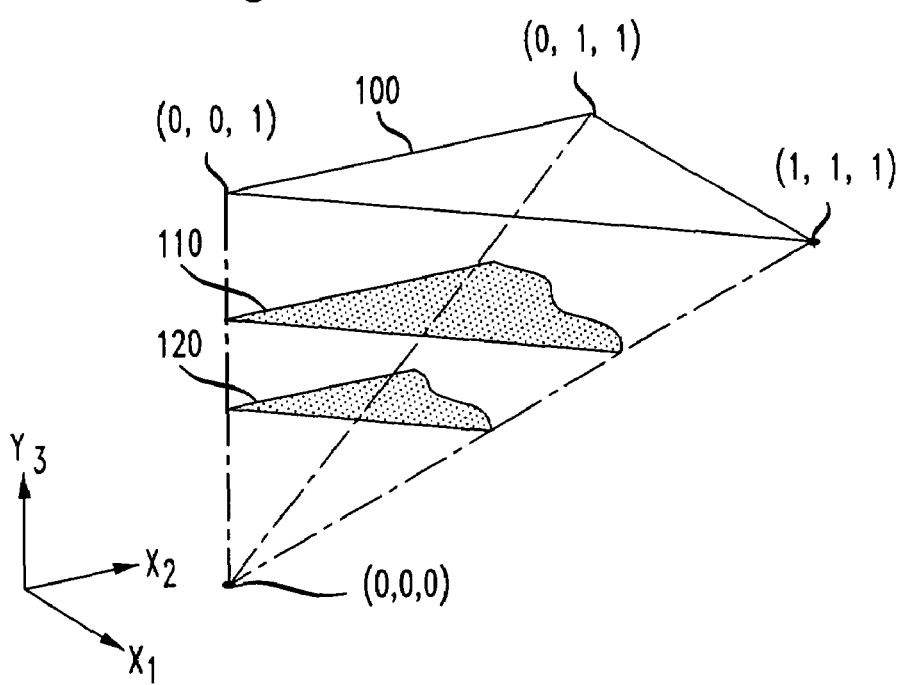
FIG. 4B depicts a solid convex region (an orthoscheme) that contains all code tuples of a weight 3 constant weight code of given length, n.

What can be further realized is that a constant weight code of weight 3 may be described by tuples having 3 numbers each which, when depicted in three dimensional space, are enclosed in a three dimensional polyhedron, a tetrahedron, with each of the four faces being right triangles. FIG. 4A depicts the tetrahedron, hereafter referred to as an orthoscheme, of a weight 3 code of length 10. The minimal bounding orthoscheme for arbitrarily large block lengths is shown in FIG. 4B.

Extending the above concepts to w dimensions, for weight w codes, one can realize that the code tuples, having w numbers each, are circumscribed by a w-dimensional simplex having an edge path consisting of w successive orthogonal vectors. A simplex with these properties is called an orthoscheme (H. S. M. Coxeter, *Regular Polytopes*, $3^{rd}$ ed., Macmillan, 1968.)

The process of coding data bits can be viewed as a process of mapping those data bits into points of the simplex that are tuples representing the codewords; and once the tuples are identified, mapping the tuples to the binary codewords. Two difficulties arise in mapping data bits into points of the simplex. First, the number of code tuples in a code is not a power of two. For example, for the weight 2, n=5, constant weight code (FIG. 1) the set of code tuples contains 10 code tuples; and for the weight 2, n=10, constant weight code (FIG. 2) the set of code tuples contains 45 code tuples. Second, the number of code tuples with certain of the coordinates fixed depends on the values of those coordinates. This can be seen by observing that the number of a code tuples at level 110 of simplex 100 (FIG. 4B), is smaller than the number of code tuples at level 120 of simplex 100.

We realized, however, that if a bijective function, or mapping, P (and its inverse, P') can be found[1], between the w-dimensional orthoscheme and a w-dimensional parallelopiped (a w-dimensional "brick"), and then the process of coding and decoding data becomes straightforward, and efficient.

[1] P'(P(a))=a where a is in A and P'(P(b))=b where b is in B, and A and B are disjoint sets.

Figure 3A:
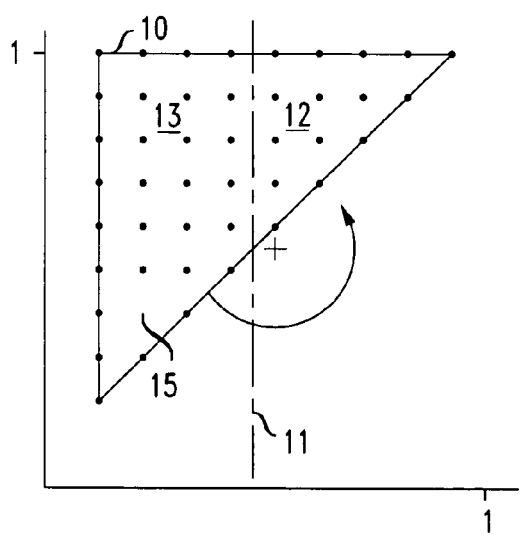
FIGS. 3A and 3B shows a mapping of a weight 2 constant code weight code—of any length—to a space where code tuples occupy a rectangular region.
Figure 3B:
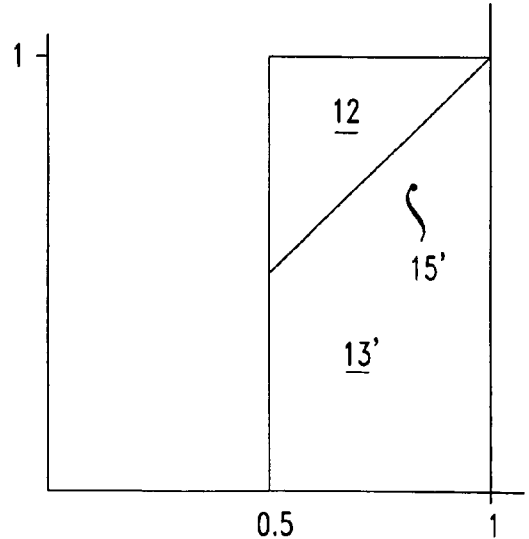

To illustrate, as demonstrated above, the code tuples of a constant weight code of length 10 and weight 2 belong to a right triangle 10 of FIG. 3A. FIGS. 3A and 3B combine to show that triangle 10 can be dissected along line 11 to yield portions 12 and 13 such that when portion 12, for example, is rotated, what results is a rectangle that is subsumed by the diagonal corners (0,0) and (0.5,1). In the FIG. 3B dissection, the ranges of $x_1$ and $x_2$ are: $0<x_1\leq 1$, $\frac{1}{2}<x_2\leq 1$, respectively. It should be mentioned that $x_1=y_1/n$.

Given an incoming stream of symbols defined by number pairs $a_1$ and $a_2$ (with dynamic ranges 0 to 4 and 0 to 8 respectively), mapping number pairs to points in the space defined by regions 12 and 13' (herein, symbols) is quite simple. What is left, then, is to map the symbols in the space defined by region 13' of FIG. 3B into code tuples in region 13 of FIG. 3A. This can be accomplished as follows. If the point falls in region 13 of FIG. 3B, it maps onto itself (i.e., nothing needs to be done). If, on the other hand, it falls in region 12' of FIG. 3B, for example, point 15', it needs to be mapped to region 12 of FIG. 3A, as code tuple 15. Mathematically, if the coordinate values of an encoded data block are $x_1$ and $x_2$, corresponding to the conventional x and y axes of FIG. 2, respectively, then, given that $$0 < x_1 \leq 1, \text{ and } \frac{1}{2} < x_2 \leq 1 \quad (3)$$

by construction, it follows that:

if $x_1 \geq x_2$ then set $x'_1 = 1-x_1$ and $x'_2 = 1-x_2+1/n$ $\quad$ (4)

else set $x'_1 = x_1$ and $x'_2 = x_2$

Figure 5:
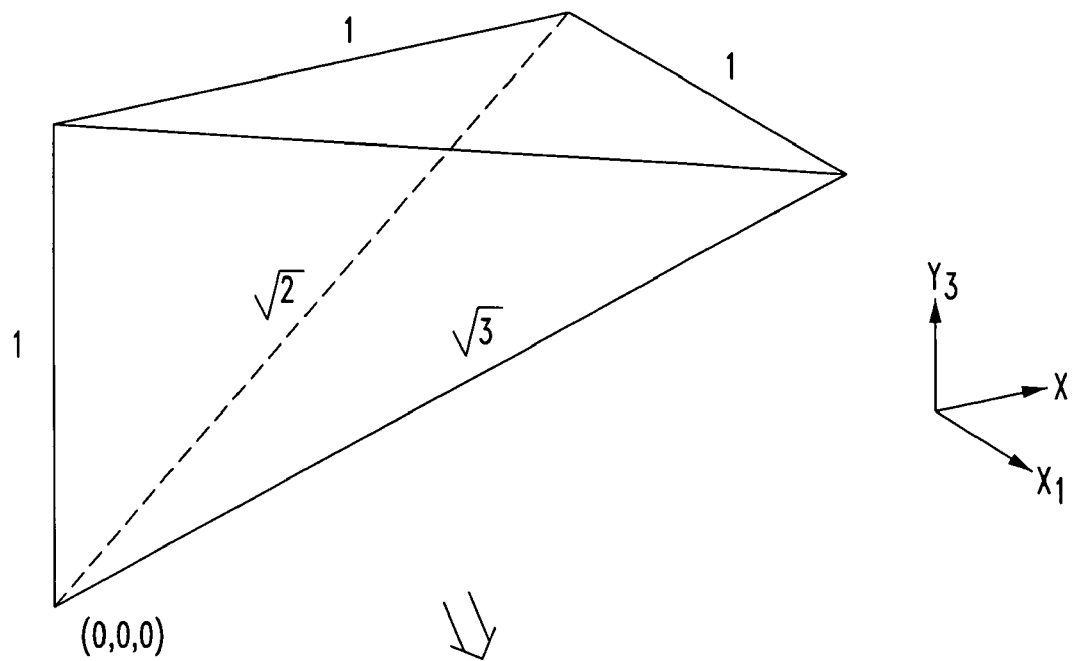
FIG. 5 shows the stepwise process for converting a 3-dimensional orthoscheme into a 3-dimensional "brick"
Figure 5:
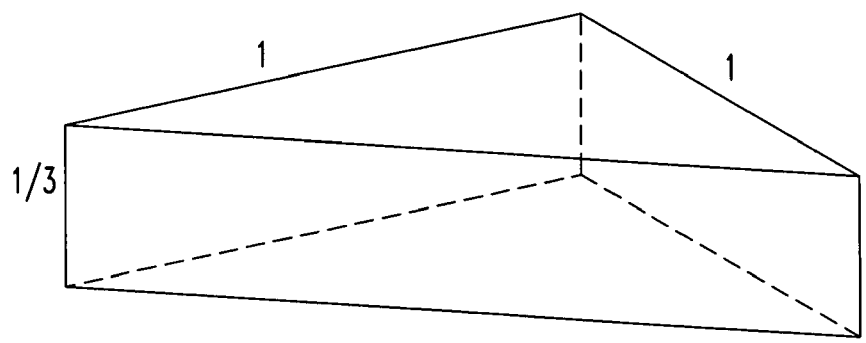
Figure 5:
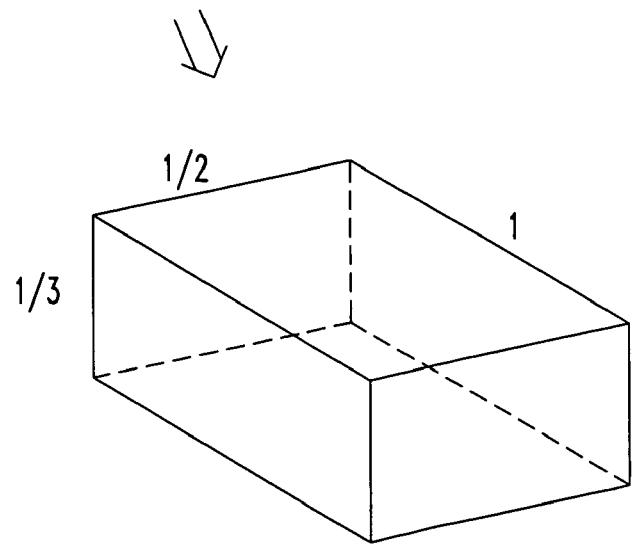
Figure 6A:
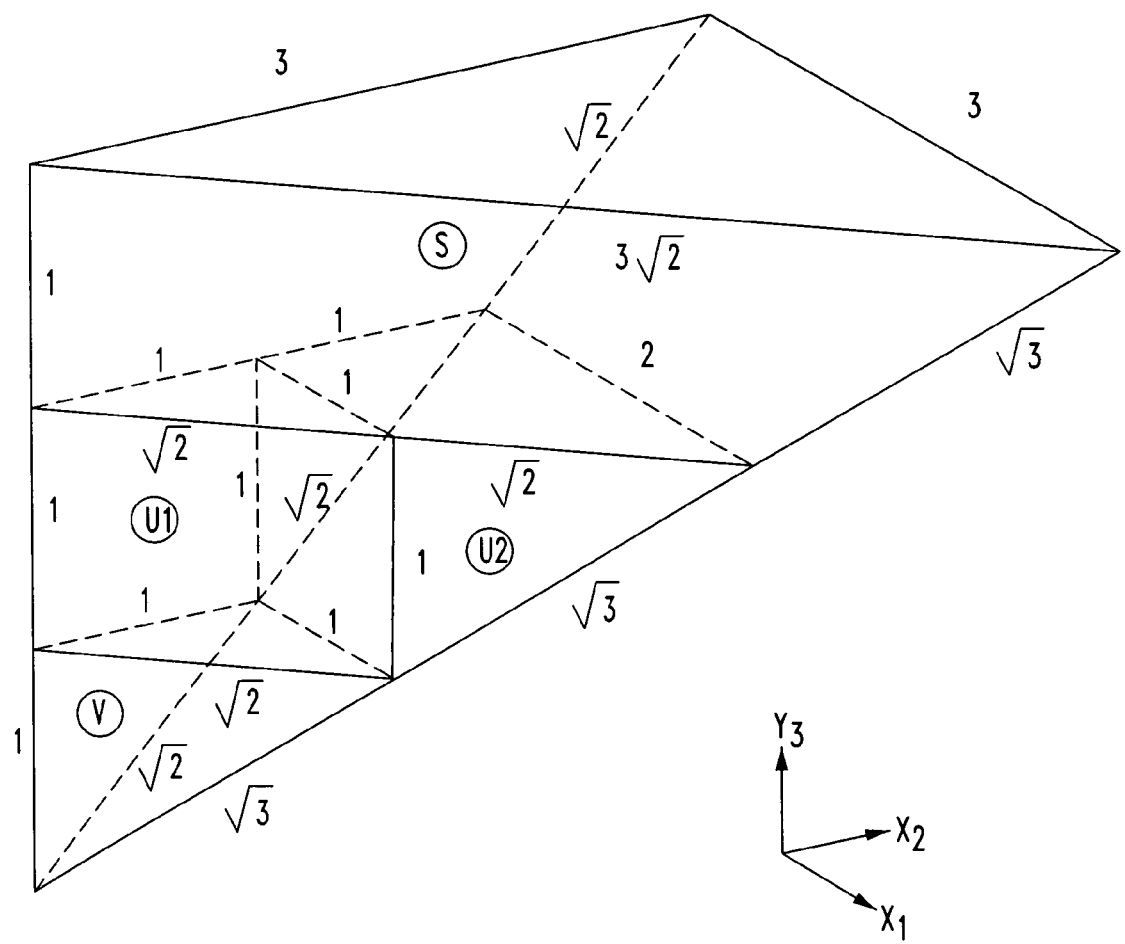
FIG. 6A shows one way of dissecting (cutting) the orthoscheme in order to convert it to a prism.
Figure 6B:
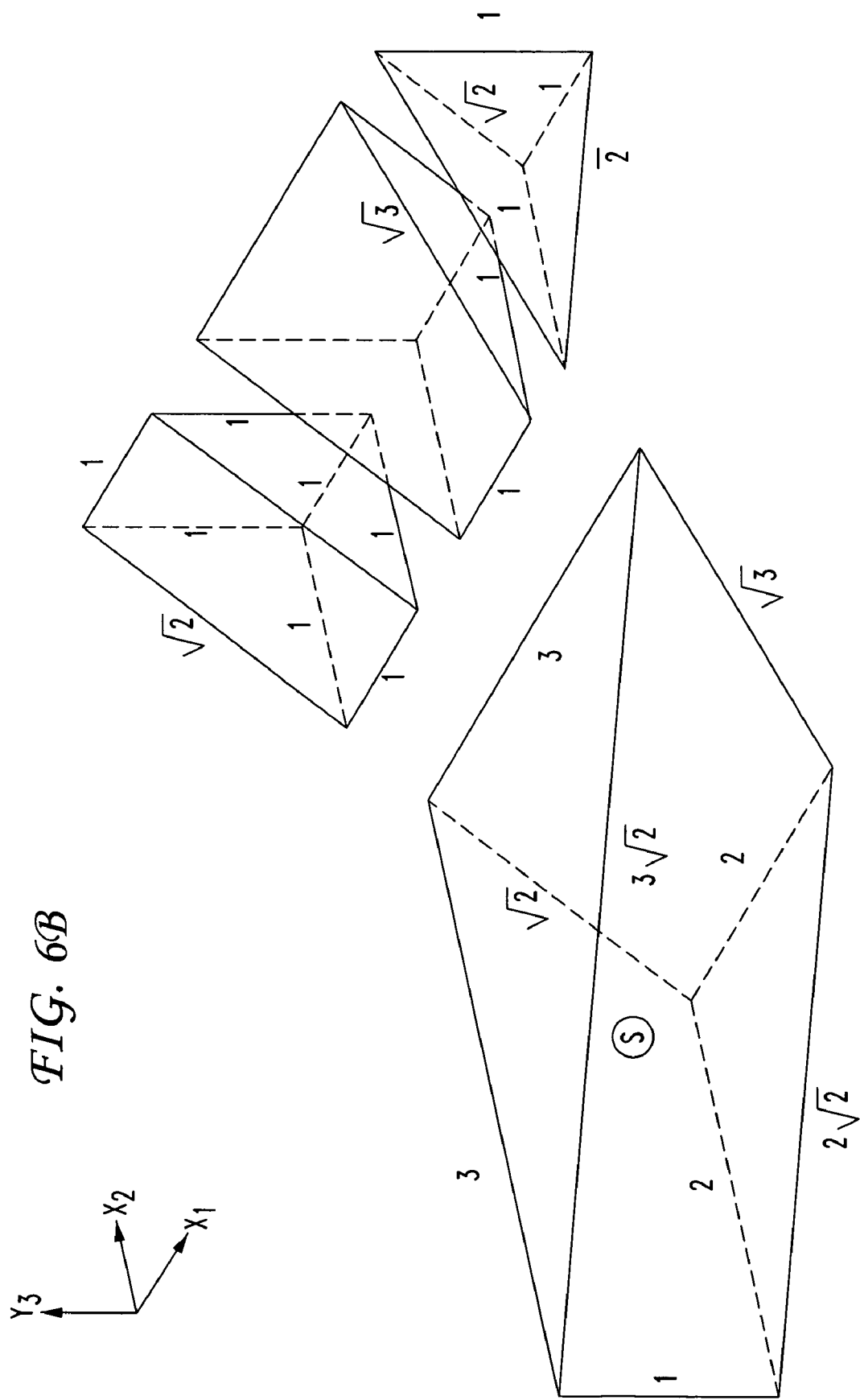
FIG. 6B shows how the cut pieces may be rearranged to form the prism.

Similarly for codes of weight 3, an inductive process exists for converting the orthoscheme to a "brick." This is illustrated in FIG. 5, where a 3 dimensional simplex is converted to a prism, and then converted to a brick. The resulting range of values for the (asymptotic) brick is $0<x_1<1$, $\frac{1}{2}<x_2<1$, and $\frac{2}{3}<x_3<1$. The conversion from the simplex to the prism is shown in FIGS. 6A, and B. Specifically, the 3-dimensional simplex of FIG. 6A, which has an equilateral right triangle base with legs being 3 units long, is cut into thirds to form solids S, U, and V, the middle third is dissected into solids U1 and U2, and solid U2 is reflected about the plane that contains the trapezoid with legs 2, $\sqrt{2}$, 1, $\sqrt{3}$. Solids U1, U2 (reflected) and V are appended to solid s as shown in FIG. 6B to form the prism of height 1 and a right triangle base of 3.

Algorithmically, the same result is achieved by first handling the mapping of a point's $x_1$ and $x_2$ coordinates, and then handling the mapping of the $x_3$ coordinate.

It is hard to visualize dissections in dimensions greater than 3, and even harder to visualize the necessary mapping of points from the brick (into which the symbols of a block of data are mapped) to the simplex (to create code tuples), and vice versa, so an alternative approach for visualization is needed.

Figure 7A:
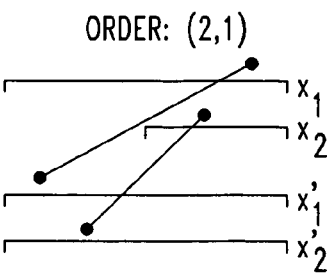
FIG. 7 presents an alternative pictorial view (an interval diagram) of the algorithm for weight 2 constant weight codes.
Figure 7B:
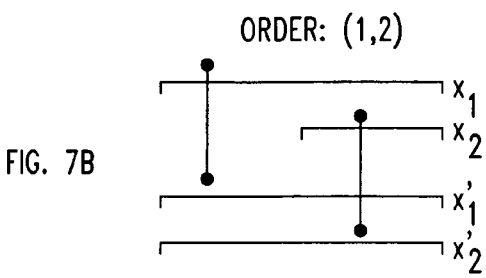

Returning to two dimensions, as can be seen from FIGS. 7A, B, which shows the range of possible values of $x_1$ and $x_2$, two possibilities exist: $x_1 \geq x_2$, or $x_2 > x_1$. In the first case, shown in FIG. 7A, the value of $x_2$ is less than the value of $x_1$. It this case, the mappings $x'_1=1-x$, and $x'_2=1-x_2+1/n$ are carried out. In the second case, no mapping is necessary, as is demonstrated by FIG. 7B.

Once the relationship of $x_1$ and $x_2$ is properly set; that is, insuring that $x_1$ is smaller than $x_2$, one proceeds to the third dimension, to handle $x_3$.

Our aim is to convert the orthoscheme of FIG. 6A to the brick which is defined by the ranges $0<x_1 \leq 1$, $\frac{1}{2}<x_2 \leq 1$, and $\frac{2}{3}<x_3<1$. Given that $x_2>x_1$, only three situations can occur:

$$x_1<x_2<x_3$$
$$x_1<x_3<x_2 \text{ or} \tag{5}$$
$$x_3<x_1<x_2$$

FIG. 8 which actually shows 4 situations, with the $x_1<x_3<x_2$ situation separated into the sub-situation where $x_1 \geq \frac{1}{3}$ and the sub-situation where $x_1 < \frac{1}{3}$. The operation for the case where $x_1<x_2<x_3$, which is the correct order, is shown in FIG. 8A, and is a mapping of the point to itself; i.e., the "do-nothing" or the identity transformation. The operation for the case where $x_1<x_3<x_2$ is to subtract a value in order to reduce $x_2$. Since $x_2$ can be just slightly higher than $x_3$ and $x_3$ can be as low as $\frac{2}{3}$, it would appear that one could subtract $\frac{2}{3}$. However, since $x_1$ can be very low, the algorithm subtracts $\frac{2}{3}$ modulo 1, and for $x_1$ that means that $\frac{1}{3}$ is added. This is shown in FIG. 8B where the resulting values are also re-labeled, with the modified $x_1$ becoming $x_3'$ and the modified $x_3$ becoming $x_1'$. When, however, $x_1$ is greater than $\frac{1}{3}$, $\frac{1}{3}$ can be subtracted from all coordinates. This is shown in FIG. 8C where the resulting values are also relabeled, with the modified $x_2$ becoming $x_3'$ and the modified $x_3$ becoming $x_2'$. Lastly, the operation for FIG. 8D is to subtract $\frac{2}{3}$ from each value and re-label $x'_1$ as $x'_2$, $x'_2$ as $x'_3$, and $x'_3$ as $x'_1$.

The set of operations that are depicted in FIG. 8 actually form a single, unified piecewise linear algorithm, and that meets the objective of having a simple, reversible, algorithm. It must be reversible in the sense that given a symbol, which is the encoded representation of data, the reverse process of mapping from a code tuple to a symbol should be achievable.

We discovered a piecewise algorithm that is not only simple and reversible, but also contains information within the symbols that informs the user as to how to map forward, and also within the code tuples to inform the user as to how to reverse the map. The mappings shown in FIGS. 7 and 8 embody this algorithm from which, for example, the following may be observed relative to the forward mapping.

Figure 8A:
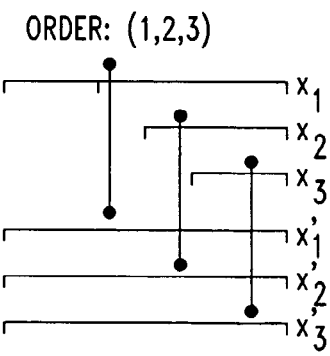
FIG. 8 presents a pictorial view of the algorithm for weight 3 constant weight codes.
Figure 8B:
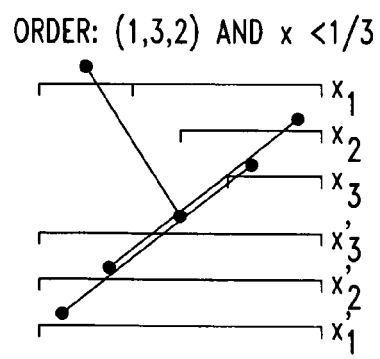
Figure 8D:
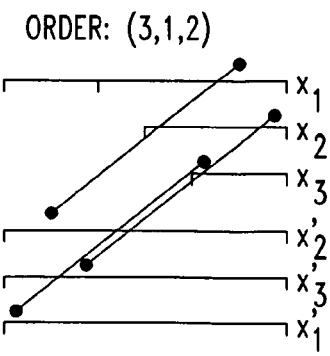
Figure 8C:
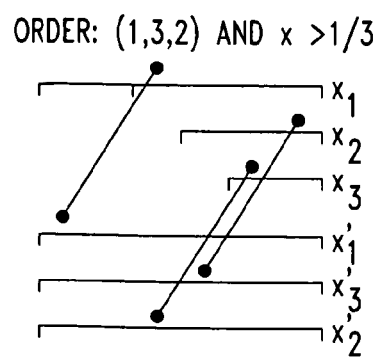

Before delving into the algorithm's equations, let us observe that the added dimension, $x_3$, is last in the order of FIG. 8A (1,2,3), but is in the middle in the of FIGS. 8B and 8C (1.3.2), and is first in the order of FIG. 8D (3,1,2). In other words, the position of $X_3$ in the order distinguishes the different possible situations, except for the grouping of FIGS. 8B and 8C. However, the value of coordinate $x'_1$ is greater than $\frac{1}{3}$ in FIG. 8B, and is less than $\frac{1}{3}$ in FIG. 8C. This information is sufficient to define the algorithm that is to be employed.

To reiterate, we discovered a piecewise algorithm that is simple and reversible, and also inherently relies on the data to determine how the forward and reverse mappings are to be carried out. Moreover, the algorithm applies to dimensions higher than 3, meaning that may be used for constant weight code of any desired weight. The following describes the algorithm in mathematical terms which, as indicated above, is iterative in the sense that it starts with handling 2 coordinates, then handles the third coordinate, then the fourth coordinate, etc.

Expressed formally, the problem is to find a bijection between set $A_w$ and $B_w$, assuming that the required bijection between $A_{w-1}$ and $B_{w-1}$ is already known. The induction is advanced by finding a bijection between $$B_{w-1} \times \left(\left(1 - \frac{1}{w}\right), 1\right)$$

and $B_w$ (where the × designates the Cartesian product of two sets). The $w^{th}$ step in the forward mapping, $$B_{w-1} \times \left(\left(1 - \frac{1}{w}\right), 1\right) \to B_w$$

is described by the following.

The input to the forward mapping is the vector $(x_1, x_2, x_3, K, x_w)$ where $(x_1, x_2, x_3, K, x_{w-1}) \in B_{w-1}$ and $$x_w \in \left(\left(1 - \frac{1}{w}\right), 1\right).$$

The mapping produces the vector $(x'_1, x'_2, x'_3, K, x'_w)$ where $(x'_1, x'_2, x'_3, K, x'_{w-1}) \in B_{w-1}$, Forward mapping: $f_w$ 1) Compute $i_o = \min_{x_w \leq x_i, 1 \leq i \leq w} i$ and $j_0 = \min_{x_i \geq \frac{w-i_0+i-1}{w}, 1 \leq i \leq i_0} (i-1)$ (6)

2) Compute $x'_k = \begin{cases} x_{k+j_0} - \frac{w+j_0-i_o}{w} & k = 1, K, i_0 - j_0 - 1, \\ x_w - \frac{w+j_0-i_0}{w} & k = i_0 - j_0, \\ x_{k+j_0-1} - \frac{w+j_0-i_0}{w} & k + j_0 = i_0+1, K, w, \\ x_{k-(w-j_0)} + \frac{i_0-j_0}{w} & k = w-j_0+1, K, w. \end{cases}$ (7)

The above piecewise equation identifies the shift and switch operations required to obtain $x'_k$ for different ranges of the variable k. We follow the convention that if the starting index of a range of k-values is smaller than the ending index, the range is empty, and the corresponding transformation is not carried out. Also if an index for x is not in the range 1, ..., w, it is regarded as a void index, and thus voids the operation. Note that $i_0=w$ implies $j_0=0$, in which case Step 2 is the identity.

The next algorithm describes the $w^{th}$ step in the inverse mapping $g_w$ to recover symbols from code tuples:

$$B_w \to B_{w-1} \times \left(\left(1-\frac{1}{w}\right), 1\right],$$

where the input to the mapping is the vector $(x'_1, x'_2, x'_3, K, x'_w) \in B_w$. The output is the vector $$x \in B_{w-1} \times \left(\left(1-\frac{1}{w}\right), 1\right],$$

where $x=(x_1, x_2, x_3, K, x_w)$.

Inverse Mapping: $g_w$

1) Let $m_0 = \max_{x'_i \geq \frac{i-1}{w}, 1 \leq i \leq w} i$ (8)

2) Let $j_0 = \begin{cases} w - \left(\max_{x'_i \geq \frac{m_0}{w}, m_0+1 \leq i \leq w} i\right), & m_0 \neq w, \\ 0, & m_0 = w, \end{cases}$ (9)

and let $i_0 = j_0 + m_0$.

3) then x is obtained from x' by:

$$x_k = \begin{cases} x'_{k+(w-j_0)} - \frac{i_0 - j_0}{w}, & k = 1, K, j_0, \\ x'_{k-j_0} + \frac{w + j_0 - i_0}{w}, & k = j_0 + 1K, i_0 - 1, \\ x'_{k-j_0+1} + \frac{w + j_0 - i_0}{w}, & k = i_0, K, w - 1, \\ x'_{i_0-j_0+1} + \frac{w + j_0 - i_0}{w}, & k = w. \end{cases}$$ (10)

To apply the above algorithm to the problem of encoding and decoding constant weight codes, positive integers must be used, and this results in a certain rate loss. The algorithms remain largely unchanged. In a manner analogous to the real-valued case, we find a bijection between $A_w^N \subset N^w$ and $B_w^N \subset N^w$ for given w and n ($n>2w$), where $$\left\{(y_1, y_2, \ldots, y_w) \in N^w : n-(w-i) - \left\lfloor \frac{n-(w-i)}{i} \right\rfloor + 1 \leq y_i \leq n-(w-i),\right.$$

$$\left. i = 1, 2, K, w\right\}$$

and $B_w^N = \{(y_1, y_2, \ldots, y_w) \in N^w : 1 \leq y_1 \leq y_2 < \ldots < y_w \leq n\}$. Note that usually $|A_w^N| \leq |B_w^N|$, which means rate loss is generated.

The following algorithm provides the forward mapping, i.e., $$\left\{(y_1, y_2, \ldots, y_w) : (y_1, y_2, \ldots, y_{w-1}) \in B_{w-1}^N,\right.$$

$$\left. n - \left\lfloor \frac{n}{w} \right\rfloor + 1 \leq y_w \leq n\right\} \to B_w^N.$$

Given w and $n=pw+q$, where $p \geq 0$ and $0 \leq q \leq w-1$, we divide the range $1, 2, \ldots, n$ into w partitions, where the first $n-w-1$ partitions each have p elements, and the next q partitions each have $p+1$ elements, and the last partition has p elements, which makes up the total n elements.

1) Let $i_0 = \min_{y_w \leq y_i, 1 \leq i \leq w} i$ and $j_0 = \min_{y_i > T_i, 1 \leq i \leq i_0} (i-1)$ (11)

where $T_i = (w-i_0+i-1)p + \max(q-i_0+i, 0)$.

2) Let $y'_k = \begin{cases} y_{k+j_0} - T_{j_0+1} & k = 1, K, i_0 - j_0 - 1 \\ y_w - T_{j_0+1} & k = i_0 - j_0 \\ y_{k+j_0-1} + 1 - T_{j_0+1} & k + j_0 = i_0 + 1, K, w \\ y_{k-(w-j_0)} + n - T_{j_0+1} & k = w - j_0 + 1, K, w \end{cases}$ (12)

The following algorithm provides the inverse mapping $$B_w^N \to$$

$$\left\{(y_1, y_2, \ldots, y_w) : (y_1, y_2, \ldots, y_{w-1}) \in B_{w-1}^N, n - \left\lfloor \frac{n}{w} \right\rfloor + 1 \leq y_w \leq n\right\}.$$

Again, assume $n=pw+q$.

1) Let $m_0 = \max_{y'_i > S_i, 1 \leq i \leq i_0} i$ (13)

where $S_i = q + (i-1)p + \min(i-q-1, 0)$.

2) Let $j_0 = \begin{cases} w - \left(\max_{y'_i \leq S_{m_0+p}, m_0+1 \leq i \leq w} i\right), & m_0 \neq w \\ 0, & m_0 = w \end{cases}$ (14)

$i_0 = j_0 + m_0$

The overall complexity of the transform algorithm is $O(w^2)$, because at each induction step, the complexity is linear in the weight at that step. Recall that the complexities of the arithmetic coding method and Knuth's complementation method are both $O(n)$. Thus when the weight w is larger than $\sqrt{n}$, the geometric approach is less competitive. When the weight is low, the proposed geometric technique is more efficient, because Knuth's complementation method is not applicable, while the dissection operations of the proposed algorithm makes it faster than the arithmetic coding method. Furthermore, due to the structure of the algorithm, it is possible to parallelize part of the computation within each induction step to further reduce the computation time.

So far little has been said about mapping a binary sequence to an integer sequence $y_1, y_2, \ldots, y_w$ such that $y_i \in |L_i, U_i|$, where $L_i$ and $U_i$ are the lower and upper bound of the valid range as specified by the algorithm. A straightforward method is to treat the binary sequence as an integer number and then use "quotient and remainder" method to find such a mapping. However, this requires a division operation, and when the binary sequence is long, the computation is not very efficient. A simplification is to partition the binary sequence into short sequences, and map each short binary sequence to a pair of integers, as in the case of a weight two constant weight codes. Through proper pairing of the ranges, the loss in the rate can be minimized.

The overall rate loss consists of two parts, where the first part is from the rounding in using natural numbers, and the second is from the loss in the above simplified translation step. However, when the weight is on the order of $\sqrt{n}$, and n is in the range of 100-1000, the rate loss is usually 1-3 bits per block. For example, when n=529, w=23, then the rate loss is 2 bits/block compared to the best possible code which would encode $k_0$=132 information bits.

The invention claimed is:

1. A method for encoding symbols into constant weight codes, where the symbols are contained in an m-dimensional parallelopiped having edges that are of different length in each of the m dimensions, comprising the steps of:

mapping the symbols to an m-dimensional orthoscheme to form code tuples, each of which containing m numbers; and converting the code tuples to codes that contain a 1 in certain ordinal positions of the code, and 0s elsewhere, where the numbers of a code tuple designate the ordinal positions of the 1s in the code.

2. The method of claim 1 where the mapping is iterative.

3. The method of claim 1 is iterative, taking mapping two dimensions, followed by a mapping of one additional dimension with each additional iteration.

4. The method of claim 3 where each mapping involves operations taken from the set including additions, subtractions, and re-labeling of dimensions.

5. The method of claim 3 where the mapping is a piecewise mapping based on value of one of the dimensions that is being mapped.

6. The method of claim 3 where the mapping is piecewise linear.

* * * * *